United States Patent [19]

Serizawa

[11] Patent Number: 5,748,839
[45] Date of Patent: May 5, 1998

[54] QUANTIZATION OF INPUT VECTORS AND WITHOUT REARRANGEMENT OF VECTOR ELEMENTS OF A CANDIDATE VECTOR

[75] Inventor: Masahiro Serizawa, Tokyo, Japan

[73] Assignee: NEC Corporation, Tokyo, Japan

[21] Appl. No.: 426,649

[22] Filed: Apr. 21, 1995

[30] Foreign Application Priority Data

Apr. 21, 1994 [JP] Japan ................................. 6-083272

[51] Int. Cl.$^6$ .................................................. G10L 5/00
[52] U.S. Cl. .......................... 395/2.31; 395/2.3; 395/2.29
[58] Field of Search .................................. 381/36, 35, 40, 381/43, 49; 395/2.31, 29, 2.28, 2.32, 2.3

[56] References Cited

U.S. PATENT DOCUMENTS

| | | | |
|---|---|---|---|
| 4,727,354 | 2/1988 | Lindsay | 340/347 |
| 4,922,508 | 5/1990 | Moriya | 375/34 |
| 4,959,870 | 9/1990 | Tachikawa | |
| 4,969,192 | 11/1990 | Chen et al. | 381/31 |
| 5,077,798 | 12/1991 | Ichikawa et al. | 381/36 |
| 5,194,864 | 3/1993 | Nakano | 341/106 |
| 5,255,346 | 10/1993 | Wu et al. | 395/23 |
| 5,323,486 | 6/1994 | Taniguchi et al. | 395/2.31 |
| 5,384,891 | 1/1995 | Asakawa et al. | 395/2.29 |
| 5,524,170 | 6/1996 | Matsuo et al. | 395/2.31 |

FOREIGN PATENT DOCUMENTS

WO91 17540  11/1991  WIPO.

OTHER PUBLICATIONS

Patent Abstracts of Japan, Abstract of JP-A 2 082 167.
Patent Abstracts of Japan, Abstract of JP-A 2 055 425.
J. Adoul et al., "Nearest Neighbor Algorithm for Spherical Codes from the Leech Lattice," IEEE Transactions on Information Theory, vol. 34, No. 5, Sep. 1988, pp. 1188–1202.
L. Luzheng et al., "Composite Permutation Coding of Speech Waveforms," ICASSP 86, Tokyo (1986), pp. 2359–2362.

Edral Paksoy et al., "Variable Rate Speech Coding with Phonetic Segmentation", IEEE Proc. ICASSP—93 (1994), pp. II-155-II-158.

W. Bastiaan Kleijn et al., "Fast Methods for the CELP Speech Coding Algorithm", IEEE Transactions on Acoustics, Speech, and Signal Processing, vol. 38, No. 5 (Aug. 1990), pp. 1330–1342.

(List continued on next page.)

*Primary Examiner*—Allen R. MacDonald
*Assistant Examiner*—Vijay B. Cehawan
*Attorney, Agent, or Firm*—Sughrue, Mion, Zinn, Macpeak & Seas, PLLC

[57] ABSTRACT

For quantizing input vectors into output codes with reference to quantization vectors with reduction of a memory capacity, a vector quantizer device comprises a rearranging unit (21, 23) between a codebook circuit (17) preliminarily loaded, in accordance with codebook indexes, with code vectors selected from the quantization vectors to produce at least one candidate vector in response to a current index and a distance calculator (15) for calculating, between each input vector and comparison vectors given by the candidate vector, distance values for supply to an evaluation circuit (19) for producing a selected index indicative of one of the comparison vectors that minimizes the distance values and for successively producing the output codes with the selected index used as each output code, without or with addition of a rearrangement index. When the rearrangement index is and is not added, the rearranging circuit produces the candidate vector in each comparison vector as an unchanged vector and as a rearranged vector in which vector elements of the candidate vector are rearranged, respectively. The rearranging unit may rearrange the candidate vector in compliance with a single predetermined rule or with rules preliminarily stored in a rearrangement table circuit (23) in accordance with table indexes with one of the rules delivered to a rearranging circuit (21) in response to the rearrangement index.

17 Claims, 2 Drawing Sheets

OTHER PUBLICATIONS

Manfred R. Schroeder et al., "Code–Excited Linear Prediction (CELP): High–Quality Speech at Very Low Bit Rates", IEEE Proc. ICASSP—85 (1985), pp. 937–940.

Isabel M. Trancoso et al., "Efficient Search Procedures for Selecting . . . in Stochastic Coders", IEEE Transactions on Acoustics, Speech, and Signal Processing, vol. 38, No. 3, Mar. 1990, pp. 385–396.

Shigeru Ono, "Recent Advances in Speech Coding Techniques", Nippon Onkyô Gakkai Si, vol. 48, No. 1 (1992), pp. 52–59.

QUANTIZATION OF INPUT VECTORS AND WITHOUT REARRANGEMENT OF VECTOR ELEMENTS OF A CANDIDATE VECTOR

BACKGROUND OF THE INVENTION

This invention relates to quantization of input vectors into output codes and, more particularly, to a vector quantizing method and a vector quantizer device, both of which are for quantization of the type described and are for use typically in quantizing a speech signal into the output codes of a low bit rate, such as 4 kbps or below.

Code excited linear prediction (CELP) is excellently applied to such a vector quantizer device. The code excited linear prediction is described, for example, in a paper submitted by Manfred S. Schroeder and Bishnu S. Atal to the IEEE Proc. ICASSP-85 (1985), pages 937 to 940 under the title of "Code-Excited Linear Prediction (CELP): High-Quality Speech at Very Low Bit Rates".

According to the code excited linear prediction, a speech signal is divided into linear prediction coefficients and an excitation signal therefor. The excitation signal is quantized by a vector quantizer device. A speech encoder of the code excited linear prediction is ordinarily implemented either by a digital signal processor or by an electronic digital computer. It is desirable in this case in order to attain a low cost and a small power consumption that the vector quantizer device should have a smallest possible memory capacity. For reduction of the memory capacity of a codebook used in the vector quantizer device, use has been made of k-channel vector quantization, algebraic vector quantization, multi-stage vector quantization, shift-overlap vector quantization, and others. Such manners of vector quantization are described in an article contributed by Shigeru Ono to, when transliterated according to ISO 3602, "Nippon Onkyo Gakkai Si", Volume 48, No. 1 (1992), pages 52–59, under the title of "Recent Advances in Speech Coding Techniques" as translated in the article.

In a conventional vector quantizer device, code vectors are preliminarily stored in the codebook. The code vectors are either all independent of one another or have at least partly a common part. When the code vectors have a common part, it is possible to reduce the memory capacity. The shift-overlap vector quantization is a representative in this event and is described in an article contributed By Bastiaan Kleijn and two others to the IEEE Transactions on Acoustics, Speech, and Signal Processing, Volume 38, No. 5 (August 1990), pages 1330 to 1342, under the title of "Fast Methods for the CELP Speech Coding Algorithm".

In the manner which will later be described more in detail, a conventional vector quantizer device comprises a codebook circuit preliminarily loaded with code vectors in accordance with codebook indexes with each code vector composed of a predetermined number of vector elements to produce at least one candidate vector of the code vectors in response to a current index selected from the codebook indexes for each of input vectors which should be quantized into output codes. A distance calculator calculates distances between each of the input vectors and at least two comparison vectors given by the at least one candidate vector to produce distance values representative of the distances. An evaluation circuit evaluates the distance values to select one of the comparison vectors as a selected vector that minimizes the distance values. The evaluation circuit thereby produces a selected index indicitive of the selected vector to successively produce the output codes with the selected index used as each output code.

On calculating the distances, the distance values may be weighted in accordance with impulse responses. It is known for reduction of an amount of calculation of weighting to resort to autocorrelation approximation or approach. The autocorrelation approximation is described in an article contributed by Isabel M. Trancoso and another to the IEEE Transactions of Acoustics, Speech, and Signal Processing, Volume 38, No. 3 (March 1990), pages 385 to 396, under the title of "Efficient Search Procedure for Selecting the Optimum Innovation in Stochastic Coders".

In the manner described in the foregoing, the vector quantizer device should have a smallest possible memory capacity. When the bit rate is low, it is usual to use a long vector length. As a result, a small memory capacity becomes more urgent. It is possible to reduce the memory capacity by rendering the codebook circuit structive. This, however, results in another problem of deteriorating a quantization performance.

SUMMARY OF THE INVENTION

It is consequently an object of the present invention to provide a vector quantizing method of quantizing input vectors into output codes, by which method it is possible to use a codebook circuit of a small memory capacity. it is another object of this invention to provide a vector quantizing method which is of the type described and which in capable of little deteriorating a quantization performance.

It is still another object of this invention to provide a vector quantizing method which is of the type described and which need a small amount of calculation.

It is yet another object of this invention to provide a vector quantizer device for carrying out a vector quantizing method of the type described.

Further objects of this invention will become clear as the description proceeds.

In accordance with an aspect of this invention, there is provided a vector quantizing method which is for quantizing input vectors into output codes and comprises the steps of preparing a codebook circuit loaded with code vectors in accordance with codebook indexes with each code vector composed of a predetermined number of vector elements, producing at least one candidate vector of the code vector in response to a current index selected from the codebook indexes for each input vector, calculating distances between the above-mentioned each of input vectors and comparison vectors given by the at least one candidate vector to produce distance values representative of the distances, and evaluating the distance values to select one of the comparison vectors as a selected vector that minimizes the distance values, the evaluating step producing a selected index indicative of the selected vector to successively produce the output codes with the selected index used as each output code, wherein the vector quantizing method comprises the step of using in the comparison vectors the at least one candidate vector as an unchanged vector without rearrangement, of its vector elements and the at least one candidate vector as a rearranged vector with rearrangement of its vector elements in response to a rearrangement index, the evaluating step producing the selected index with no change of and with addition of the rearrangement index to the current index when the selected vector is the unchanged and the rearranged vectors, respectively.

In accordance with a different aspect of this invention, there is provided a vector quantizer device which is for quantizing input vectors into output codes and comprises a codebook circuit preliminarily loaded with code vectors in accordance with codebook indexes with each code vector composed of a predetermined number of vector elements to produce at least one candidate vector of the code vectors in response to a current index selected from the codebook indexes for each of the input vectors, a distance calculator for calculating distances between the above-mentioned each of input vectors and comparison vectors given by the at least one candidate vector to produce distance values representative of the distances, and an evaluation-circuit for evaluating the distance values to select one of the comparison vectors an a selected vector that minimizes the distance values, the evaluation circuit producing a selected index indicative of the selected vector to successively produce the output codes with the selected index used as each output code, wherein the vector quantizer device comprises vector rearranging means between the codebook circuit and the distance calculator for using in the comparison vectors the at least one candidate vector as an unchanged vector without rearrangement of its vector elements and the at least one candidate vector as a rearranged vector with rearrangement of its vector elements in response to a rearrangement index, the evaluation circuit producing the selected index with no change of and with addition of the rearrangement index to the current index when the selected vector is the unchanged and the rearranged vectors, respectively.

DESCRIPTION OF THE PREFERRED EMBODIMENTS

Figure 1:
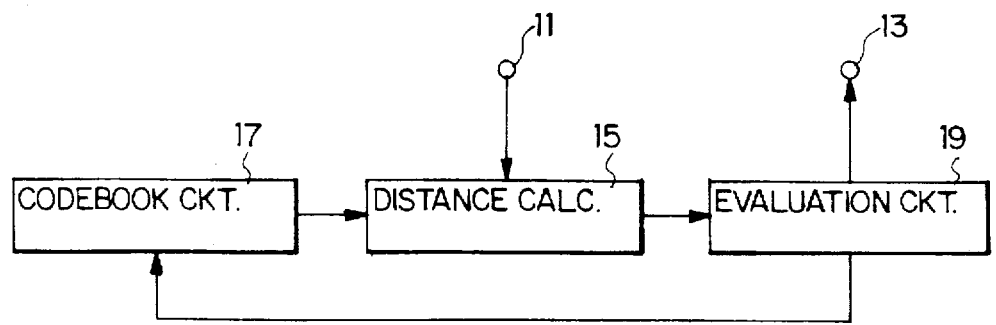
FIG. 1 is a block diagram of a conventional vector quantizer device.

Referring to FIG. 1, a conventional vector quantizer device will first be described in order to facilitate an understanding of the present invention. Such a vector quantizer device is known in the art and is for quantizing a device input signal representative of input vectors into a device output signal indicative of output codes.

In FIG. 1, the vector quantizer device has a device input terminal 11 supplied with the device input signal and a device output terminal 13 to which the vector quantizer device produces the device output signal. From the device input terminal 11, the input vectors are delivered to a distance calculator 15 to which a codebook circuit 17 supplies from codebook code vectors preliminarily stored therein in accordance with codebook indexes several candidate vectors in response to a current index selected from the codebook indexes for each input vector in the manner which will presently be described. The codebook indexes specify the codebook code vectors, respectively. Several of the codebook code vectors are therefore selected as the candidate vectors by a corresponding number of codebook indexes. Depending on the circumstances, only one candidate vector is selected. Such at least one codebook index is herein referred to as a current index.

The distance calculator 15 calculates distances between each input vector and the candidate vectors and supplies an evaluation circuit 19 with distance values representative of the distances. Evaluating the distance values, the evaluation circuit 19 delivers back to the codebook circuit 17 a command indicative of a next index for use afresh as the current index. In response to this fresh current index, the codebook circuit 17 delivers different candidate vectors to the distance calculator 15. When the evaluation circuit 19 finishes evaluation of the distance values related to the codebook code vectors produced by the codebook circuit 17, the evaluation circuit 19 selects one of such candidate vectors as a selected vector that minimizes the distance values. While the input vectors are successively processed, the evaluation circuit 19 produces, as the output codes, selected indexes indicative of the selected vectors to successively produces the selected indexes with the selected index used as each output code.

It is ordinary to use a long vector length (for example, 10 msec long, namely, eighty samples long when the input vectors are sampled at a sampling frequency of 8 kHz) when a low bit rate is used for the output codes, such as 4 kbps or below. The codebook circuit 17 must consequently have a large memory capacity. It is possible to reduce the memory capacity by using a structured codebook. This, however, gives rise to another problem of deteriorating a quantisation performance or capability of quantizing the input vectors into the output codes.

It will be presumed in the foregoing that the codebook code vectors are S in number in the codebook circuit 17 and that each codebook code vector is an N-dimentional vector consisting of N vector elements, where N represents a predetermined natural number. The codebook code vector will be denoted by $C(s, n)$, where s represents the codebook index specific to the codebook code vector under consideration and is variable between 1 and S, both inclusive, n representing the vector elements numbered consecutively from 1 to N in an ascending order. When the codebook code vectors are independent of one another, the memory capacity is equal to SN.

It is possible to reduce an amount of calculation in the distance calculator 15 by resorting to autocorrelation or frequency domain approximation or approach on weighting the distance values by impulse response of a weighting filter. It is necessary on using the autocorrelation approximation to additionally calculate an autocorrelation factor B of a weighing function by using an autocorrelation function $u(i)$ of each codebook code vector with a lag i and another autocorrelation function $V(i)$ of an impulse response of the lag i of the weighting filter, where i is variable consecutively increasing from 0 up to (L−1), where L represents in turn an ampulse response length of the weighting filter. Under the circumstances, the autocorrelation factor is given as follows:

$$B = u(0)v(0) \qquad (1)$$
$$= 2[u(1)v(1) + u(2)v(2) + \ldots + u(L-1)v(L-1)].$$

In accordance with the autocorrelation approximation, the amount of calculation is satisfactorily reduced. It is, however, necessary to use an additional memory capacity of SL for the autocorrelation functions of the codebook code vectors. A total memory capacity of S(N+L) is therefore indispensable.

Figure 2:
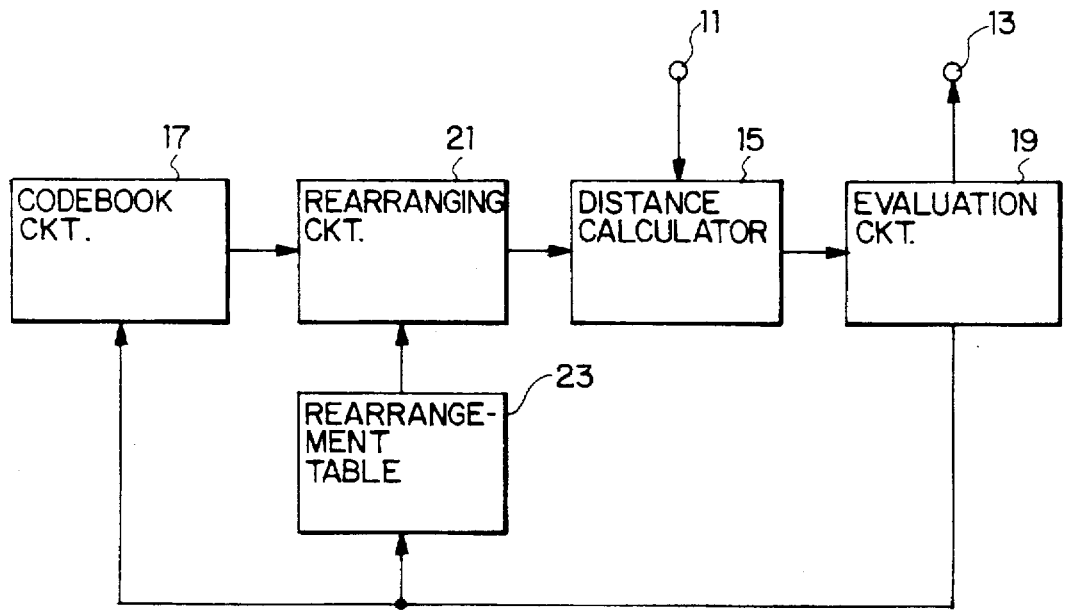
FIG. 2 is a block diagram of a vector quantizer device according to a first embodiment of the instant invention.

Referring now to FIG. 2, attention will be directed to a vector quantiser device according to a first embodiment of this invention. Similar parts are designated by like reference numerals and are similarly operable with likewise named signals and quantities.

Between the distance calculator 15 and the codebook circuit 17, interposed is a table dependent rearranging or reordering circuit 21 for rearranging the codebook code vector specified by the current index and produced from the codebook circuit 17 as the candidate vector into a rearranged vector in response to rearrangement information indicative of a manner in which the vector elements of the candidate vector are rearranged into the vector elements of the rearranged vector. The rearrangement information is supplied from a rearrangement table circuit 23 in which such manners of rearrangement are preliminarily stored in accordance with table indexes and in correspondence to the codebook code vectors specified by the codebook indexes. When the candidate vector is produced in response to the current index, the rearrangement information indicative of a pertinent manner is produced in response to a rearrangement index produced by the evaluation circuit 19 accompanying the current index indicative of that candidate vector to indicate one of the table indexes that specifies the pertinent manner.

When supplied with the rearrangement information in this manner, the table dependent rearranging circuit 21 delivers the rearranged vector to the distance calculator 15. If supplied with no rearrangement information, the rearranging circuit 21 delivers the candidate vector to the distance calculator 15 as an unchanged vector without rearrangement of the vector elements of this candidate vector. In such a manner, the rearranging circuit 21 supplies the distance calculator 15 with at least two comparison vectors for each input vector. In other words, such comparison vectors are delivered to the distance calculator 15 for the input vectors as the unchanged vectors and/or as the rearranged vectors.

It should be noted in this connection that the codebook circuit 17 produces at least one candidate vector in response to the current index. The rearranging circuit 21 produces either an unchanged or a rearranged vector for each candidate vector. It will nevertheless be said that either an unchanged or a rearranged vector is delivered in the comparison vectors to the distance calculator 15 for the at least one candidate vector.

For use in quantizing various input vectors by the vector quantizer device being illustrated, code vectors will now be referred to as quantization code vectors or simply as quantization vectors. It will be presumed as above that S quantization vectors C(s, n) should be used and that a first number S(1) of the quantization vectors are for use in the comparison vectors as the unchanged vectors with a second number S(2) of the quantization vectors used as the rearranged vectors.

Under the circumstances, the codebook circuit 17 must have a codebook memory capacity of S(1)N. If the rearranged vectors of a set should be produced by the rearranging circuit 21 in respective or individual manners of rearrangement, the rearrangement table circuit 23 must have a table memory capicity of S(2)N. The vector quantizer device must accordingly have a total memory capacity of SN and is not different from the memory capacity of a conventional case illustrated with reference to FIG. 1.

The manners of rearrangement are consequently selected in the example being illustrated as common manners so as to be common for candidate vectors which the codebook circuit 17 produces at least from predetermined ones of the codebook code vectors. It is thereby possible to reduce the manners of rearrangement to D in number for the common manners, where D is less than the second number. The total memory capacity becomes equal to (S(1)+D)N with a reduction of (S(2)−D) as compared with the conventional case.

The vector quantizer device of FIG. 2 is different from the conventional vector quantizer device illustrated with reference to FIG. 1 in that the codebook code vectors comprise in the codebook circuit 17 the predetermined ones of quantization vectors for use by the table dependent rearranging circuit 21 either as the unchanged rectors or as the rearranged vectors and that the common manners of rearrangement are selected in common to respective or individual parts of the predetermined ones and are preliminarily stored in the rearrangement table circuit 23. The codebook code vectors may or may not include other code vectors other than the predetermined ones. If included, these other code vectors are used in the comparison vectors solely as the unchanged vectors. Each of the common manners is common to a part of the predetermined ones and is specified among the table indexes by the rearrangement index. Being at least a part of the codebook code vectors, the predetermined ones are specified by at least a part of the codebook indexes.

Figure 3:
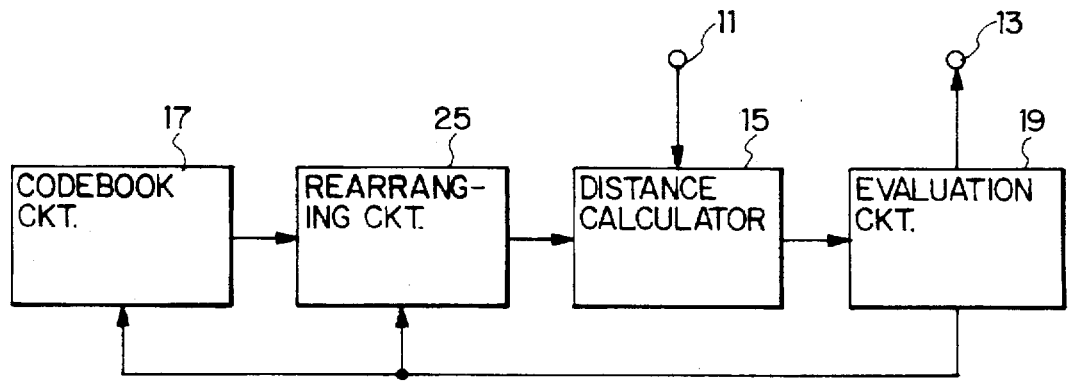
FIG. 3 is a block diagram of a vector quantizer device according to a second embodiment of this invention.

Referring to FIG. 3, the description will proceed to a vector quantizer device according to a second embodiment of this invention. Similar parts are designated by like reference numerals and are similarly operable with likewise named signals and quantities.

A single rule rearranging or reordering circuit 25 is substituted for a combination of the table dependent rearranging circuit 21 and the rearrangement table circuit 23 described in conjunction with FIG. 2. From the evaluation circuit 19, the command is delivered directly to the single rule rearranging circuit 25 so that the single rule rearranging circuit 25 should or should not rearrange the at least one candidate vector into the rearranged vector in compliance with a single predetermined rule which will presently be exemplified. In other words, the single rule rearranging circuit 25 produces the at least one candidate vector in the comparison vectors either as the unchanged vector or as the rearranged vector in compliance with a predetermined manner alone.

In FIG. 3, rearrangement of the candidate vector or vectors is carried out in the single manner. The total memory capacity is therefore rendered equal to S(1)N and is S(2)N less than the conventional case.

The single rule may, for example, to rearrange the vector elements of each candidate vector in a completely inverted order. More particularly, let one of the codebook code vectors be C(s(1), n) where s(1) is variable between 1 and the first number, both inclusive, n representing the vector elements numbered consecutively from 1 to N in the ascending order as described before. In this event, the rearranged vector is an order inverted vector C(s(2), j), where s(2) is variable between 1 and the second number, both inclusive, j representing the vector elements N, (N−1), ... , 2, and 1 of the above-mentioned one of the codebook code vectors, which vector elements are consecutively numbered from N to 1 in a descending order. That is:

$$C(s(2), j) = C(s(2), N-n+1). \qquad (2)$$

It will be surmised as before that D candidate vectors are rearranged into D rearranged or order inverted vectors. In this case, the total memory capacity of the vector quantizer device becomes equal to (S−D)N and is DN less than the conventional case.

It will now be assumed that the autocorrelation approximation is resorted to in addition to use of the single predetermined rule of complete inversion of the order of the vector elements. The autocorrelation factor B of Equation (1) is calculated for each of the candidate vectors and of the rearranged vectors. In the illustrated example, D codebook code vectors have an autocorrelation function which is identical with that of the D rearranged vectors. For example:

$$u(s(1), i) = \sum_{k=1}^{N-1} C(s(1), k)C(s(1), k-i),$$

and $$u(s(2), i) = \sum_{k=1}^{N-1} C(s(2), k)C(s(2), k-i).$$

(3)

By using Equation (2) and by conversion of variables, Equations (3) become:

$$u(s(2), i) = \sum_{k=1}^{N-1} C(s(1), N+1-k)C(s(1), N+1-k-i),$$

and $$u(s(2), i) = \sum_{m=1}^{N-1} C(s(1), m)C(s(1), m-i).$$

Therefore:

$$u(s(1), i) = u(s(2), i) \quad (4)$$

for i=1, 2, ..., L Equation (4) shows that a reduction of DL is possible in a memory capacity for calculation of the autocorrelation function B. Furthermore, a reduction of L times is possible in an amount of calculation of Equation (1). When a half of the quantization vectors are used as a memory capacity D of the codebook circuit 17, the amount of calculation is reduced to a half.

When compared with the vector quantizer device illustrated with reference to FIG. 2, the vector quantizer device comprises in FIG. 3 the single rule rearranging circuit 25 for producing the candidate vectors as the unchanged vectors or as the rearranged vectors when the evaluation circuit 19 produces each output code without and with addition of the rearrangement index to the current index, respectively. On rearranging each candidate vector into the rearranged vector, use is made of the single predetermined rule, such as a rule exemplified by Equation (2).

Figure 4:
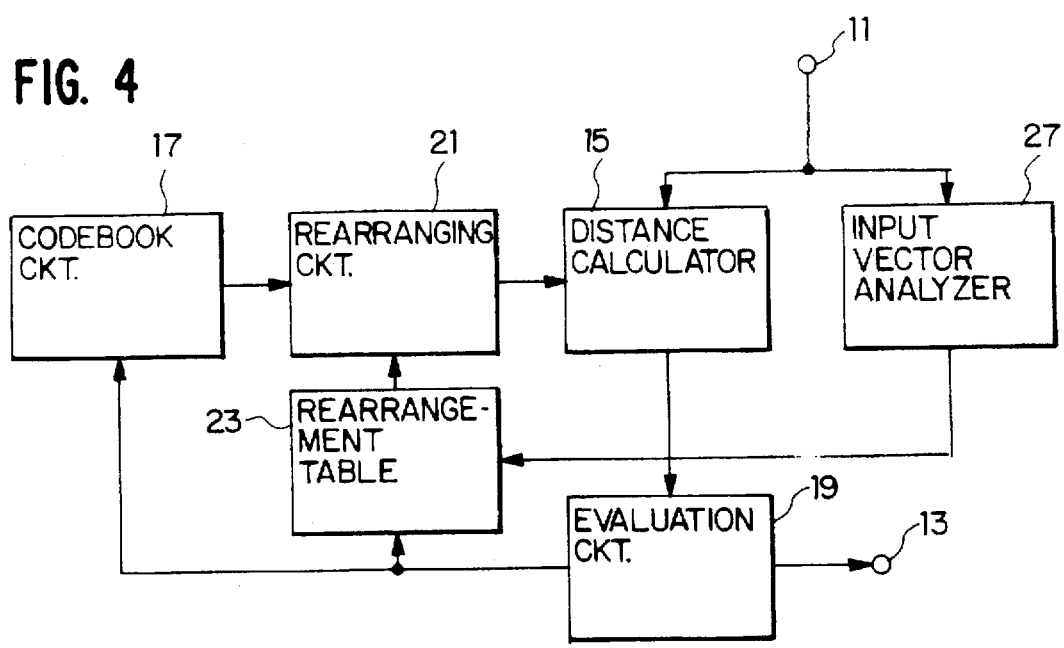
FIG. 4 is a block diagram of a vector quantizer device according to a third embodiment of this invention.

Referring to FIG. 4, a vector quantizer device is according to a third embodiment of this invention. As before, similar parts are designated by like reference numerals and are similarly operable with likewise named signals and quantities.

In FIG. 4, the table dependent rearranging circuit 21 and the rearrangement table circuit 23 are again used. In addition, an input vector analyzer 27 is interposed between the device input terminal 11 and the rearrangement table circuit 23 to analyze characteristics of each input vector and to use a result of analysis in switching the rearrangement table circuit 23 between a quiescent or inactive state and an active state in cooperation with the current index delivered from the evaluation circuit 19 without and with addition of the rearrangement index, respectively.

It will be assumed by way of example that each input vector represents a sequential succession of a consonant and a vowel or of a vowel and a consonant. For use in indicating the result of analysis, the input vector analyzer 27 may produce mode zero and one signals when each input vector represents the succession of a consonant and a vowel and of a vowel and a consonant, respectively.

Under the circumstances, the codebook circuit 17 is loaded with the codebook code vectors, each representative of the succession of a consonant and a vowel. For such sequential successions specified by the table indexes, the table indexes specify the common manners in which the succession of a consonant and a vowel in each candidate vector is rearranged into the succession of these vowel and consonant. When supplied with the mode zero and one signals, the rearrangement table circuit 23 is quiescent and is active to make the table dependent rearranging circuit 21 produce each candidate vector in the comparison vectors as the unchanged vector and as the rearranged vector. At any rate, use of the results of analysis exempts in general the distance calculator 15 from calculation of the distance values unless the input vector analyzer 27 produces the mode zero and the mode one signals.

Whether each input vector represents the succession of a consonant and a vowel or of a vowel and a consonant, is judged by the input vector analyzer 27 operable based on, for example, an article contributed by Erdal Paksoy and two others to the IEEE Proc. ICASSP—93(1994), pages II-155 to II-158, under the title of "Variable Rate Speech Coding with Phonetic Segmentation". When the mode zero signal is produced for a part, S(2) in number, of different input vectors, S in number, the vector quantizer device of FIG. 4 makes it possible to reduce the total memory capacity to S(1)N and by S(2)N less as compared with the conventional case. Furthermore, the amount of calculation by the distance calculator 15 is reduced by S(2) times.

Figure 5:
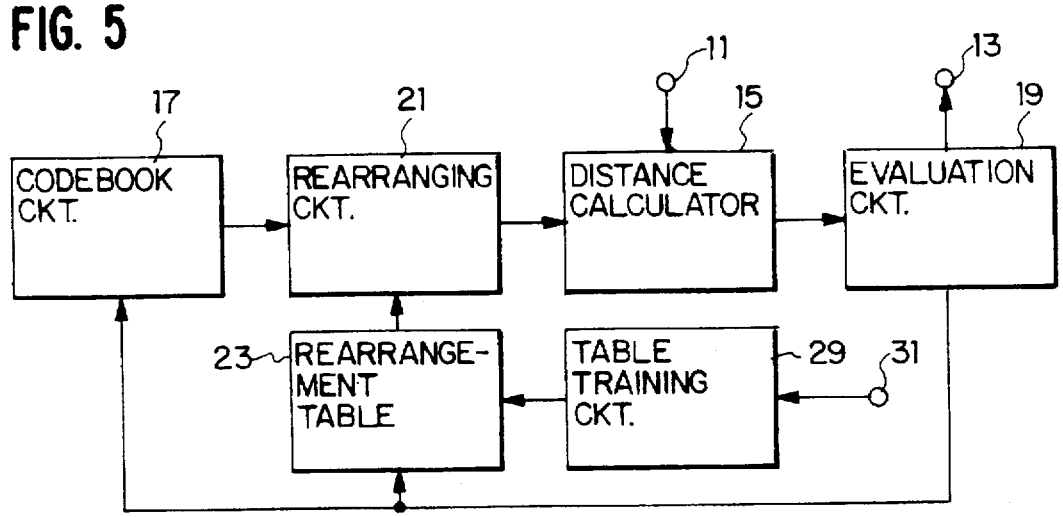
FIG. 5 is a block diagram of a vector quantizer device according to a fourth embodiment of this invention.

Turning to FIG. 5, a vector quantizer device is according to a fourth embodiment of this invention. Similar parts are again designated by like reference numerals and are similarly operable with likewise named signals and quantities.

In FIG. 5, a table training circuit 29 is added to the vector quantizer device illustrated with reference to FIG. 2. The table training circuit 29 is connected to the rearrangement table circuit 23 and to a training input terminal 31 supplied with a plurality of training vectors which include various input vectors supplied to the device input terminal 11.

Before actual quantization of such various input vectors, the rearrangement table circuit 23 is trained by the training vectors so that the vector quantizer device may have a highest possible quantization capability. More particularly, the table training circuit 29 produces in effect a plurality of rearrangement table circuits, such as 23. From these rearrangement table circuits, one is selected for actual use as the rearrangement table circuit 23 that attains the highest quantitation capability. Mere use of a small memory capacity may adversely affect the quantization capability. Additional use of the table training circuit 29 well compensates for a possible deterioration in the quantization capability.

Figure 6:
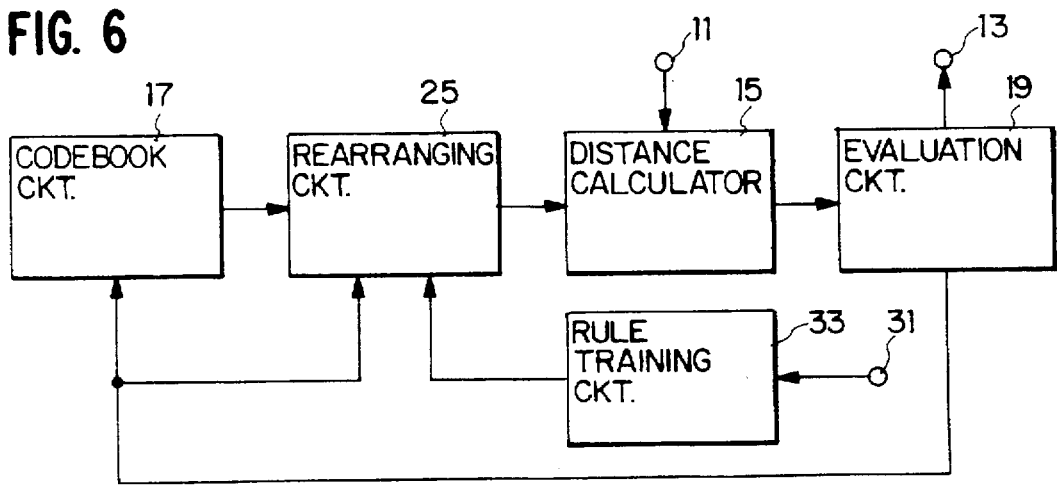
FIG. 6 is a block diagram of a vector quantizer device according to a fifth embodiment of this invention.

Further turning to FIG. 6, a vector quantizer device is according to a fifth embodiment of this invention. Similar parts are designated by like reference numerals and are similarly operable with likewise named signals and quantities.

In FIG. 6, a rule training circuit 33 is added to the vector quantizer device of FIG. 3. The rule training circuit 33 is connected to the single rule rearranging circuit 25 and to the training input terminal 31.

Before actual quantization of various input vectors, operation of the single predetermined rule is trained in the rearranging circuit 25 by the training vectors to raise the quantization capability of the vector quantizer device. More specifically, various rules are provided by the rule training circuit 33. One of these rules is used as the single predetermined rule that achieves the highest quantization capability. Training of the rule is preferred like training of the rearrangement table circuit 23.

While this invention has thus far been described in specific conjunction with several preferred embodiments thereof, it will now be readily possible for one skilled in the art to put this invention into effect in various other manners. For example, use of the vector quantizer device is not limited to quantization of a speech signal into the output codes of a low bit rate. Above all, it is possible to use similarity measures instead of the distances in the manner known in the art. In this event, maximization should be used for minimization. It should therefore be understood that use of the similarity measures is equivalent to use of the distances.

What is claimed is:

1. A vector quantizing method of quantizing input vectors into output codes, said vector quantizing method comprising the steps of:

preparing a codebook circuit loaded with code vectors in accordance with codebook indexes with each code vector composed of a predetermined number of vector elements, producing at least one candidate vector of said code vectors in response to a current index selected from said codebook indexes for each of said input vectors, calculating distances between said each of input vectors and comparison vectors given by said at least one candidate vector to produce distance values representative of said distances, and evaluating said distance values to select one of said comparison vectors as a selected vector that minimizes said distance values, said evaluating step producing a selected index indicative of said selected vector to successively produce said output codes with said selected index used as each output code, wherein said vector quantizing method comprises the step of:

using, in said comparison vectors, (1) said at least one candidate vector as an unchanged vector without rearrangement of its vector elements and (2) said at least one candidate vector as a rearranged vector with rearrangement of its vector elements, in response to a rearrangement index, wherein said evaluating step produces said selected index with no change of and with addition of said rearrangement index to said current index when said selected vector is said unchanged and said rearranged vectors, respectively.

2. A vector quantizing method as claimed in claim 1, wherein:

said vector quantizing method further comprises the step of:

preparing a rearrangement table circuit loaded, in accordance with table indexes, with common manners of converting said at least one candidate vector to said rearranged vector when said current index selects each candidate vector from predetermined ones of said code vectors, and said evaluating step produces one of said table indexes as said rearrangement index.

3. A vector quanitizing method as claimed in claim 2, wherein:

said vector quantizing method further comprises the step of:

analyzing characteristics of each input vector to produce a result of analysis, and said rearrangement table circuit makes said using step use said at least one candidate vector as said rearranged vector in compliance with one of said common manners of converting that is specified by said result of analysis.

4. A vector quantizing method as claimed in claim 2, wherein:

each input vector represents a succession of either a consonant and a vowel and a consonant, said codebook circuit preparing step makes each code vector represent the succession of a consonant and a vowel, said vector quantizing method further comprises the step of:

analyzing each input vector to judge whether said each of input vectors represents the succession of a consonant and a vowel or of a vowel and a consonant, said analyzing step makes said rearrangement table circuit select said respectfully rearranged vector with the succession of the last-mentioned vowel and the last-mentioned consonant when said analyzing step judges that each of input vectors represents the succession of a vowel and a consonant.

5. A vector quantizing method as claimed in claim 2, wherein said vector quantizing method further comprises the step of preliminarily training said rearrangement table circuit by using a plurality of training vectors which include said input vectors.

6. A vector quantizing method as claimed in claim 1, wherein said using step uses, in said comparison vectors, said at least one candidate vector with its vector elements rearranged into said rearranged vector in accordance with a single rule alone when said current index selects said at least one candidate vector from predetermined ones of said code vectors.

7. A vector quantizing method as claimed in claim 6, wherein said vector quantizing method further comprises the step of:

preliminary training said using step by using a plurality of training vectors which include said input vectors.

8. A vector quantizer device for quantizing input vectors into output codes, said vector quantizer device comprising:

a codebook circuit preliminary loaded with code vectors in accordance with codebook indexes with each code vector composed of a predetermined number of vector elements to produce at least one candidate vector of said code vectors in response to a current index selected from said codebook indexes for each of said input vectors, a distance calculator for calculating distances between said each of input vectors and comparison vectors given by said at least one candidate vector to produce distance values representative of said distances, and an evaluation circuit for evaluating said distance values to select one of said comparison vectors as a selected vector that minimizes said distance values, said evaluation circuit producing a selected index indicative of said selected vector to successively produce said output codes with said selected index used as each output code, wherein said vector quantizer device comprises vector rearranging means between said codebook circuit and said distance calculator for using in said comparison vectors said at least one candidate vector as an unchanged vector without rearrangement of its vector elements and said at least one candidate vector as a rearranged vector with rearrangement of its vector elements in response to a rearrangement index, said evaluation circuit producing said selected index with no change of and with addition of said rearrangement index to said current index when said selected vector is said unchanged and said rearranged vectors, respectively.

9. A vector quantizer device as claimed in claim 8, wherein said vector rearranging means comprises:

a rearrangement table circuit connected to said evaluation circuit and preliminarily loaded, in accordance with table indexes, with manners of rearrangement in which each candidate vector is rearranged into said rearranged vector in one of said manners of rearrangement that is specified among said table indexes by said rearrangement index; and a table dependent rearranging circuit connected to said codebook circuit, to said distance calculator, and to said rearrangement table circuit for rearranging said at least one candidate vector into said rearranged vector in said one of manners of rearrangement.

10. A vector quantizer device as claimed in claim 9, wherein:

said rearrangement table circuit is preliminary loaded, in accordance with said table indexes and in correspondence at least to predetermined ones of said code vectors, with common manners of rearrangement, each of said common manners of rearrangement being a manner of rearrangement in common to respective parts of said predetermined ones of code vectors, each of said common manners of rearrangement that is selected being common to a part of said predetermined ones of code vectors; and said table dependent rearranging circuit rearranging said at least one candidate vector into said rearranged vector in one of said common manners that is specified among said table indexes by said rearrangement index when said at least one candidate vector is one of said predetermined ones of code vectors that is specified by said current index in one of said respective parts.

11. A vector quantizer device as claimed in claim 10, wherein said vector quantizer device further comprises a table training circuit connected to said rearrangement table circuit for training said rearrangement table circuit for production of said one of common manners as an optimum manner of rearrangement in response to a plurality of training vectors which include said input vectors.

12. A vector quantizer device as claimed in claim 11, wherein said vector quantizer device further comprises a table training circuit connected to said rearrangement table circuit for training said rearrangement table circuit for production of said one of manners of rearrangement as an optimum manner of rearrangement in response to a plurality of training vectors which include said input vectors.

13. A vector quantizer device as claimed in claim 10, wherein:

said vector quantizer device further comprises an input vector analyzer for analyzing characteristics of each input vector to produce a result of analysis;

said rearrangement table circuit being connected to said input vector analyzer and made by said result of analysis to supply said table dependent rearranging circuit with one of said common manners that is specified in response to said result of analysis.

14. A vector quantizer device as claimed in claim 9, each input vector representing a succession of either a consonant and a vowel or a vowel and a consonant, each code vector representing in said codebook circuit the succession of a consonant and a vowel, wherein:

said vector quantizer device further comprises an input vector analyzer for analyzing each input vector to judge whether said each of input vectors represents the succession of a consonant and a vowel or of a vowel and a consonant, said input vector analyzer producing mode zero and one signals when said input vector analyzer judges that said each of input vectors represents the succession of a consonant and a vowel and of a vowel and a consonant, respectively;

said rearrangement table circuit being connected to said input vector analyzer and made by said mode zero and one signals to be quiescent and to produce one of said manners of rearrangement in response to said rearrangement index;

said table dependent rearranging circuit using said at least one candidate vector as said unchanged vector and as said rearranged vector with said rearranged vector made to represent the succession of the last-mentioned vowel and the last-mentioned consonant when said rearrangement table circuit is quiescent and produces the last-mentioned one of manners of rearrangement, respectively.

15. A vector quantizer device as claimed in claim 8, wherein said vector rearranging means comprises a single rule rearranging circuit connected to said evaluation circuit, to said codebook circuit, and to said distance calculator for deciding in response to said current index without and with addition of said rearrangement index that each candidate vector should be used as said unchanged vector and, in compliance with a single predetermined rule, as said rearranged vector, respectively, said each candidate vector being produced from one of said code vectors that is specified by said current index.

16. A vector quantizer device as claimed in claim 15, said vector elements being arranged in each code vector in a predetermined order, wherein said single predetermined rule is for inverting said vector elements in said rearranged vector into an inverted order relative to said predetermined order.

17. A vector quantizer device as claimed in claim 15, wherein:

said vector quantizer device further comprises a rule training circuit, connected to said single rule rearranging circuits for training said single predetermined rule for production of said rearranged vector in compliance with an optimum rule of rearrangement, and in response to a plurality of training vectors which includes said input vectors.

* * * * *